(12) United States Patent
Xie et al.

(10) Patent No.: US 9,978,608 B2
(45) Date of Patent: May 22, 2018

(54) FIN PATTERNING FOR A FIN-TYPE FIELD-EFFECT TRANSISTOR

(71) Applicant: GLOBALFOUNDRIES Inc., Grand Cayman (KY)

(72) Inventors: Ruilong Xie, Schenectady, NY (US); Min Gyu Sung, Latham, NY (US); Nigel G. Cave, Saratoga Springs, NY (US); Lars Liebmann, Halfmoon, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 15/271,511

(22) Filed: Sep. 21, 2016

(65) Prior Publication Data

US 2018/0082852 A1   Mar. 22, 2018

(51) Int. Cl.
*H01L 21/70* (2006.01)
*H01L 21/308* (2006.01)
*H01L 29/10* (2006.01)
*H01L 29/78* (2006.01)
*H01L 29/66* (2006.01)
*H01L 21/3065* (2006.01)

(52) U.S. Cl.
CPC ...... *H01L 21/3088* (2013.01); *H01L 21/3065* (2013.01); *H01L 21/3081* (2013.01); *H01L 21/3085* (2013.01); *H01L 21/3086* (2013.01); *H01L 29/1037* (2013.01); *H01L 29/66795* (2013.01); *H01L 29/7851* (2013.01)

(58) Field of Classification Search
USPC ....... 257/499, 223, 227, 291, 439, 443, 655, 257/66, 72, E21.7, E29.003, E29.295, 257/E27.1, E27.125, E27.112, E29.117, 257/E29.182, E29.202, E29.273–E29.299, 257/E29.314, E29.32, E23.016, E21.094, 257/E21.384, E21.121, E21.372, 257/E21.411–E21.416; 438/149, 163
See application file for complete search history.

(56) References Cited

U.S. PATENT DOCUMENTS

| | | | | |
|---|---|---|---|---|
| 9,269,627 | B1 * | 2/2016 | Cheng | H01L 21/02532 |
| 2007/0284669 | A1 * | 12/2007 | Abadeer | B07C 5/344 |
| | | | | 257/368 |

(Continued)

*Primary Examiner* — Tram H Nguyen
(74) *Attorney, Agent, or Firm* — Thompson Hine LLP; Francois Pagette

(57) ABSTRACT

Methods for fabricating fins for a fin-type field-effect transistor (FinFET) and fin structures for a FinFET. A conformal layer is formed that includes respective first portions on sidewalls of first hardmask sections previously formed on a substrate, a recess between the first portions on the sidewalls of each adjacent pair of the first hardmask sections, and a second portion between the substrate and the recess. The conformal layer is constituted by a second material chosen to etch selectively to the first material constituting the first hardmask sections. A spacer is formed in each recess and masks the respective second portion of the conformal layer. The conformal layer is then etched to form second hardmask sections each comprised of one of the second portions of the conformal layer. The substrate is etched with the first and second hardmask sections masking the substrate to form a plurality of fins.

17 Claims, 9 Drawing Sheets

(56) References Cited

U.S. PATENT DOCUMENTS

| | | | |
|---|---|---|---|
| 2009/0206443 A1* | 8/2009 | Juengling | H01L 27/10876 257/506 |
| 2014/0131813 A1* | 5/2014 | Liaw | H01L 27/1104 257/401 |
| 2015/0294969 A1* | 10/2015 | Lee | H01L 27/0886 257/401 |
| 2017/0125411 A1* | 5/2017 | Yu | H01L 27/0886 |

* cited by examiner

FIN PATTERNING FOR A FIN-TYPE FIELD-EFFECT TRANSISTOR

BACKGROUND

The present invention relates to semiconductor device fabrication and integrated circuits and, more specifically, to methods for patterning fins used to fabricate a fin-type field-effect transistor (FinFET) and fin structures for a FinFET.

A FinFET is a non-planar device structure for a field-effect transistor that is capable of being more densely packed in an integrated circuit than planar field-effect transistors. A FinFET includes one or more fins of semiconductor material and an overlapping gate electrode that intersects a channel within each fin. The channel in each fin is located between heavily-doped source/drain regions formed in fin sections that are not covered by the gate electrode. The fin dimensions and the number of fins determine the effective channel width of the FinFET. A FinFET device also has exhibits better electrostatic control over the channel than a planar field-effect transistor, which results in off-state leakage improvements.

Lithographic processes may be used to form the fins for a FinFET. For example, using optical photolithography, features can be formed by patterning a photoresist layer and an image of the features can be transferred into an underlying semiconductor layer to form fins. However, lithographic processes are incapable of satisfying the ever-increasing demand for smaller and more closely spaced fins.

Sidewall image transfer (SIT) involves the use of mandrels as sacrificial structures. Sidewall spacers, which have a thickness less than that permitted by the current ground rules for optical lithography, are formed on the vertical sidewalls of the mandrels. After selective removal of the mandrels, the sidewall spacers are used as an etch mask to etch an underlying hardmask and semiconductor layer, for example, with a directional reactive ion etching (RIE). Because the sidewall spacers may have a sublithographic line pitch and width, the fins formed from the underlying semiconductor layer will also have a sublithographic line pitch and width. The sidewall spacers are removed after the fins are formed.

A problem associated with forming semiconductor fins at tight pitch relates to the cutting of unwanted fins. As the available space between fins decreases, it becomes increasingly difficult to remove unwanted fins with etching and the assistance of a cut mask without adversely affecting adjacent fins due to process variation and small process margin of lithographic processes. Misalignment of the cut mask to may lead to undesired partial or complete cutting of adjacent fins.

Improved methods for patterning fins used to fabricate a fin-type field-effect transistor (FinFET) and fin structures for a FinFET are needed.

SUMMARY

In an embodiment of the invention, a method includes forming a first plurality of hardmask sections each comprised of a first material and each including sidewalls projecting from a substrate. The method further includes forming a conformal layer that includes respective first portions on the sidewalls of each of the first plurality of hardmask sections, a recess between the first portions on the sidewalls of each adjacent pair of the first plurality of hardmask sections, and a second portion between the substrate and the recess. The conformal layer is comprised of a second material chosen to etch selectively to the first material. A spacer is formed in each recess and masks the respective second portion of the conformal layer. After the spacer is formed in each recess, the conformal layer is etched to form a second plurality of hardmask sections each comprised of one of the second portions of the conformal layer. The substrate is etched with the first plurality of hardmask sections and the second plurality of hardmask sections masking the substrate to form a plurality of fins.

In an embodiment of the invention, a structure includes a first fin, a second fin, and a third fin arranged between the first fin and the second fin. The first fin, the second fin, and the third fin have a lengthwise parallel arrangement, and the first fin is widthwise spaced from the third fin by a first distance and the second fin is widthwise spaced from the third fin by a second distance different from the first distance.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
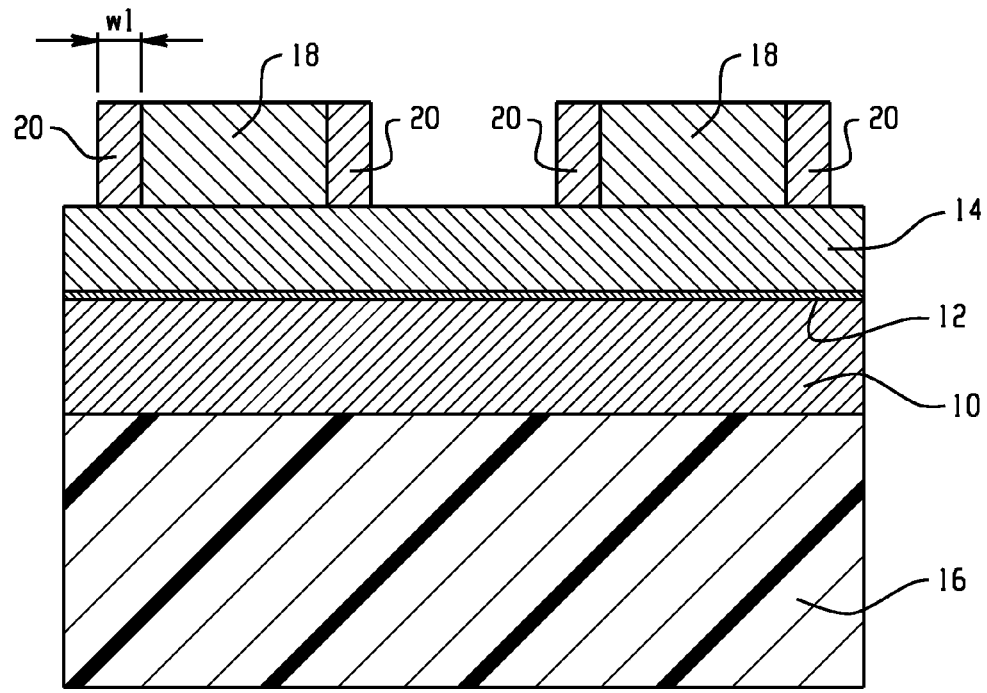
FIGS. 1-5 are cross-sectional views of a portion of a substrate at successive stages of a processing method in accordance with embodiments of the invention.

With reference to FIG. 1 and in accordance with an embodiment of the invention, a hardmask layer 10 and sacrificial layers 12, 14 are sequentially formed as a layer stack on the top surface of a substrate 16 comprised of a semiconductor material. The substrate 16 may be a bulk substrate or a device layer of a semiconductor-on-insulator (SOI) substrate. The materials forming the layers 10, 12, 14 may be selected to be readily removed by, for example, etching at a subsequent fabrication stage. The layer 10 may be composed of hydrogen-enriched silicon oxycarbide (SiCO:H) deposited by, for example, chemical vapor deposition (CVD). The layer 12 may be composed of, for example, hafnium oxide deposited by CVD. The layer 14 may be composed of, for example, silicon nitride ($Si_3N_4$) deposited by CVD. The material constituting the hardmask layer 10 may be selected to be selectively removed relative to the constituent material of the substrate 16 such that a pattern formed in the hardmask layer 10 can be transferred to the substrate 16. As used herein, the term "selective" in reference to a material removal process (e.g., etching) denotes that the material removal rate (e.g., etch rate) for the targeted material is higher than the removal rate for at least another material exposed to the material removal process.

Mandrels 18 composed of a sacrificial material are formed on a top surface of layer 14. The mandrels 18 may be formed by depositing a blanket layer of the sacrificial material on the entire top surface of layer 14 and patterning the layer by lithography and etching. The patterning can be performed, for example, by applying a photoresist layer (not shown) on the sacrificial material layer, lithographically patterning the photoresist layer to define a set of areas on layer 14 covered by the patterned photoresist layer, and transferring the pattern from the photoresist layer to the sacrificial material layer by an anisotropic etch. The anisotropic etch can be selective to the material of layer 14. The patterned portions of the sacrificial material layer constitute the mandrels 18. Each mandrel 18 may have a rectangular shape in cross-section from a perspective normal to the top surface, and the mandrels 18 may have a uniform width and pitch. The mandrels 18 may be composed of silicon, such as amorphous silicon deposited by CVD.

Spacers 20 are formed on the top surface of layer 14 at locations adjacent to the vertical sidewalls of the mandrels 18. The spacers 20 may be formed by depositing a conformal layer comprised of a dielectric material on the mandrels 18 and layer 14, and shaping the conformal layer with an anisotropic etching process, such as reactive ion etching (RIE), that preferentially removes the dielectric material from horizontal surfaces, such as the top surfaces of the layer 14 and mandrels 18. The spacers 20 have a width, w1, that is related to the thickness of the deposited conformal layer and that may be equal to the thickness of the deposited conformal layer. The spacers 20 have a length in a direction perpendicular to the width. The dimensions and pitch of the mandrels 18, as well as the thickness of the deposited conformal layer, establish the pitch of the spacers 20. In an embodiment, these parameters may be selected such that the pitch of the spacers 20 is constant or uniform. In such an embodiment, the distance between adjacent pairs of spacers 20 across the gap between different mandrels 18 may be equal to the distance between spacers 20 adjacent to opposite sidewalls of each mandrel 18.

The material constituting the mandrels 18 may be chosen to be selectively removed relative to the constituent material of the spacers 20. In an embodiment in which the mandrels 18 are composed of amorphous silicon, the spacers 20 may be composed of silicon dioxide ($SiO_2$) deposited by CVD or, alternatively, grown by thermal oxidation of the silicon constituting the mandrels 18.

Figure 2:
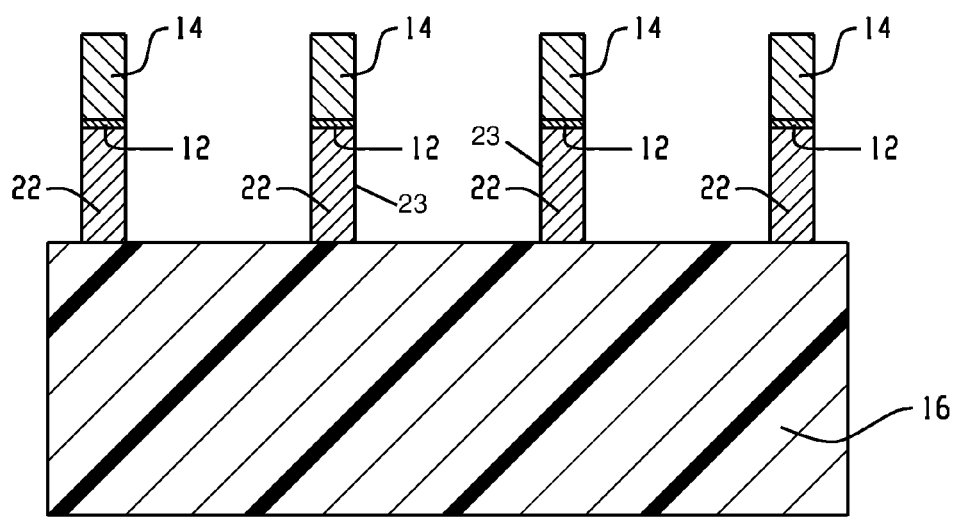

With reference to FIG. 2 in which like reference numerals refer to like features in FIG. 1 and at a subsequent fabrication stage, the mandrels 18 are removed selective to the spacers 20 with an etching process having a suitable etch chemistry. After the mandrels 18 are selectively removed, an etching process is applied to pattern the layers 10, 12, 14 by removing portions of the layers 10, 12, 14 that are not masked by the spacers 20. The etching process may be selected to stop on the substrate 16. Following or during patterning, the spacers 20 may be removed. Complementary portions of the layers 10, 12, 14 are located at the masked positions underlying the spacers 20, which transfers the pattern of the spacers 20 to the hardmask layer 10 in order to form hardmask sections 22, which are subsequently used to form fins in the process flow. The hardmask sections 22, which have sidewalls 23 that project vertically from the top surface of the substrate 16, are capped by respective residual portions of layers 12, 14.

Figure 3:
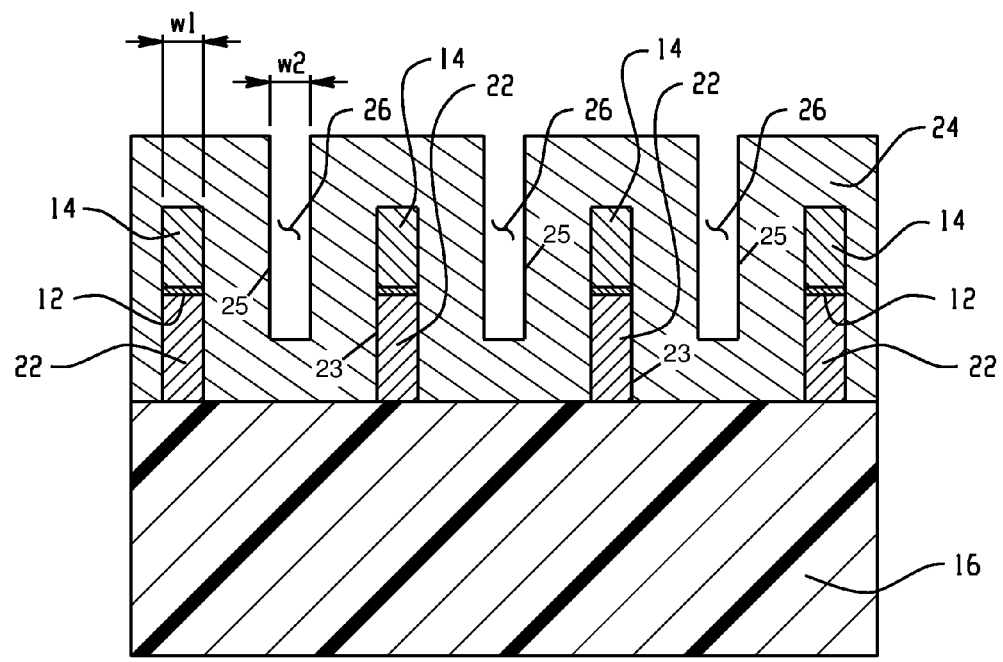

With reference to FIG. 3 in which like reference numerals refer to like features in FIG. 2 and at a subsequent fabrication stage, a conformal layer 24 is deposited that covers the hardmask sections 22 and the portions of the top surface of the substrate 16 located between adjacent pairs of the hardmask sections 22. The conformal layer 24 is separated from the top surface of each hardmask section 22 by respective sections of layers 12, 14. In particular, portions of the conformal layer 24 are located on the sidewalls 23 of the hardmask sections 22. The conformal layer 24 includes cavities or recesses 26 in the form of gaps that are located between the portions of the conformal layer 24 located on the confronting sidewalls 23 of adjacent pairs of the hardmask sections 22. The recesses 26 are located between sidewalls 25 of the conformal layer 24 that are oriented perpendicular to the top surface of the substrate 16 and that are oriented parallel to the sidewalls 23 of the hardmask sections 22. Another portion of the conformal layer 24 is located vertically between the top surface of the substrate 16 and each recess 26.

The recesses 26 are arranged on the top surface of the substrate 16 with a pitch that is directly related to the pitch of the hardmask sections 22. In particular, each recess 26 may be located halfway between an adjacent pair of the hardmask sections 22. The recesses 26 have a width, w2, that is equal to the distance between an adjacent pair of hardmask sections 22 minus twice the thickness of the conformal layer 24. The recesses 26 have a length in a direction perpendicular to the width.

The material constituting the conformal layer 24 may be chosen to be removed selective to the material constituting the hardmask sections 22, as well as to be removed selective to the semiconductor material constituting the substrate 16. In an embodiment, the conformal layer 24 may be composed of silicon nitride ($Si_3N_4$) deposited by CVD. In an embodiment, the material constituting conformal layer 24 may be the same material constituting layer 14. The conformal layer 24 has a thickness that is nominally uniform and independent of location. The deposition of the conformal layer 24 is controlled such that the recesses 26 are not closed or pinched-off during deposition. In particular, the ability to tightly control the thickness of the conformal layer 24 through the selection of deposition parameters permits tight control over the width of the recesses 26.

Figure 4:
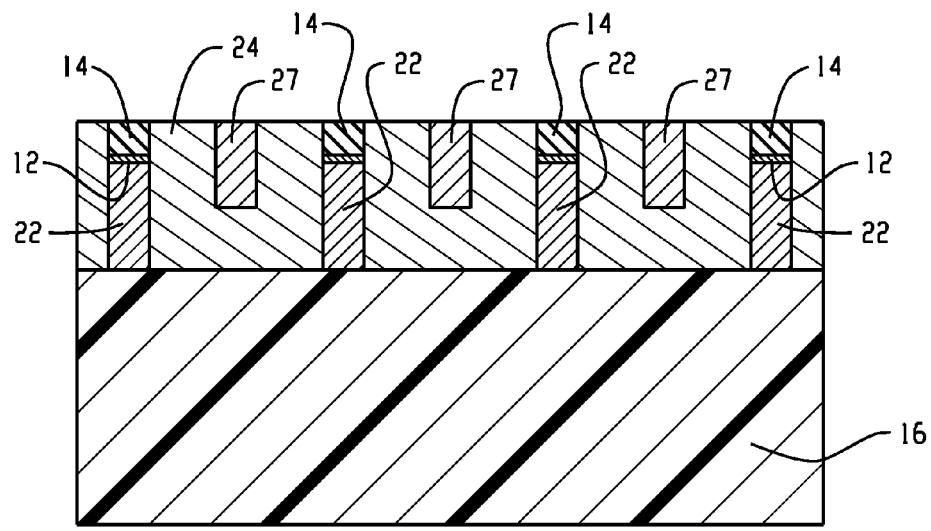

With reference to FIG. 4 in which like reference numerals refer to like features in FIG. 3 and at a subsequent fabrication stage, spacers 27 are formed in the recesses 26 (FIG. 3) in the conformal layer 24 between the sidewalls 25 and conform to the geometrical shape of the recesses 26. To that end, a layer is deposited and planarized with, for example, chemical mechanical polishing (CMP). In an embodiment, the layer and, therefore, the spacers 27 may be composed of silicon dioxide ($SiO_2$) deposited by CVD. As a consequence of planarization, the spacers 27 are embedded in the recesses 26 in the conformal layer 24. The material constituting the spacers 27 is chosen to be selectively removed relative to the constituent material of the conformal layer 24 through the choice of a suitable etch chemistry.

Figure 5:
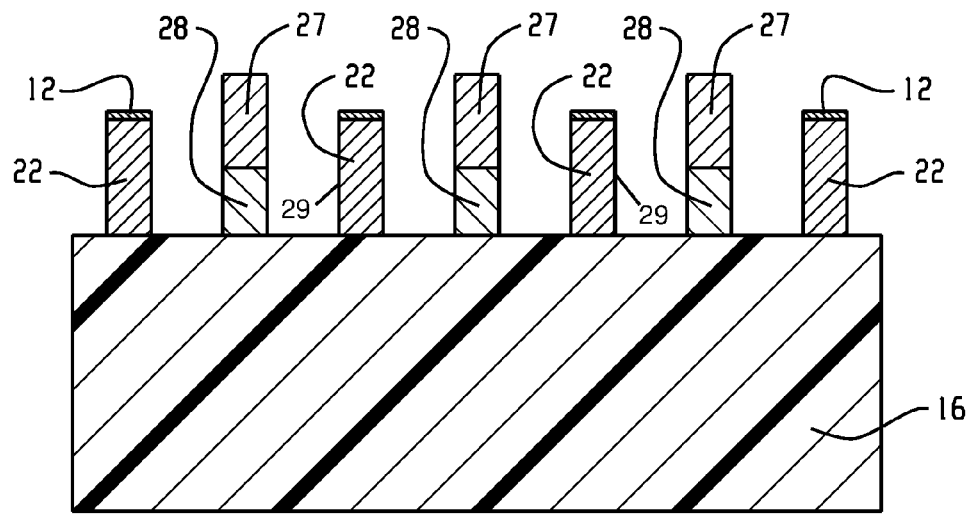

With reference to FIG. 5 in which like reference numerals refer to like features in FIG. 4 and at a subsequent fabrication stage, the conformal layer 24 is etched with a directional etching process, such as reactive ion etching (ME). The portions of the conformal layer 24 located vertically between the top surface of the substrate 16 and each spacer 27 are masked and protected by the spacers 27, which operate as an etch mask. The pattern of the spacers 27 is transferred to these portions of the conformal layer 24 to define hardmask sections 28 that are subsequently used as a hardmask to form fins in the process flow. The material of the conformal layer 24 is also removed selective to the hardmask sections 22 and the sacrificial layer 12 capping the hardmask sections 22. The sections of the sacrificial layer 12 and, optionally, the sacrificial layer 14 may be subsequently removed from the hardmask sections 22. The hardmask sections 28 have sidewalls 29 that project vertically from the top surface of the substrate 16, and that are oriented parallel to the sidewalls 23 of the hardmask sections 22. The hardmask sections 28 may be shorter in height than the hardmask sections 22.

The hardmask sections 22 and hardmask sections 28 have a lengthwise parallel arrangement in which the hardmask sections 22 and hardmask sections 28 sequentially alternate in respective spatial patterns on the top surface of the substrate 16. In particular, the hardmask sections 22 and hardmask sections 28 are interleaved in that the hardmask sections 22, which are arranged in one sequence, alternate with hardmask sections 28, which are arranged in another sequence, in a cyclic fashion such that each sequence retains its identity. The hardmask sections 22, 28 are asynchronously formed at different times in the process flow with the hardmask sections 28 being formed after the hardmask sections 22 and based at least in part on the prior formation of the hardmask sections 22. The hardmask sections 22 and hardmask sections 28 form elements of a hardmask that can be used to form fins from the semiconductor material of the substrate 16. The hardmask sections 28 are offset from the hardmask sections 22, and the offset distance may be selected to provide a uniform pitch, in combination with a uniform width, for the composite set of hardmask sections 22, 28.

The material constituting the conformal layer 24 and, therefore, the hardmask sections 28 is chosen to be selectively removed relative to the constituent material of the hardmask sections 22 through the choice of a suitable etch chemistry. As a consequence of the specific selection of materials for the hardmask sections 22 and the hardmask sections 28, one or more of the hardmask sections 22 may be removed selective to hardmask sections 28 or, alternatively, one or more of the hardmask sections 28 may be removed selective to hardmask sections 22. In the representative embodiment, hardmask sections 22 are comprised of hydrogen-enriched silicon oxycarbide (SiCO:H) and hardmask sections 28 are comprised of silicon nitride ($Si_3N_4$), which constitute a selected set of materials having the requisite etch selectivity. The ability to selectively etch one or the other of the hardmask sections 22 or hardmask sections 28 introduces flexibility into the fin cutting process.

Figure 6:
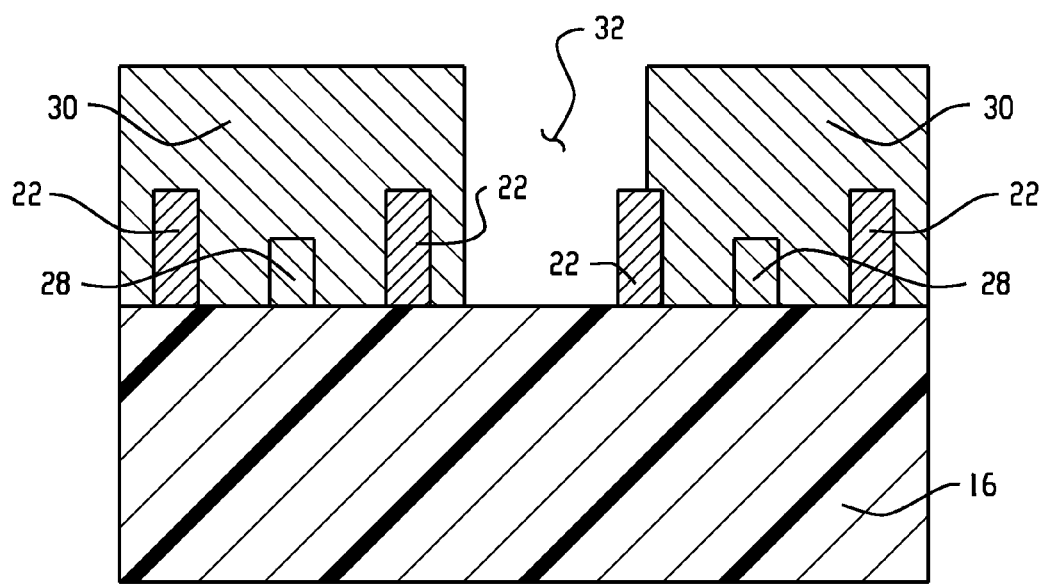
FIG. 6 is a cross-sectional view of the substrate portion of FIG. 5 at a subsequent stage of a processing method in accordance with embodiments of the invention.

With reference to FIG. 6 in which like reference numerals refer to like features in FIG. 5 and at a subsequent fabrication stage, a cut or etch mask 30 may be applied and patterned to form a window or opening 32 that exposes one of the hardmask sections 28 for removal with an etching process. The opening 32 may be formed relative to the location of the hardmask section 28 to be removed with an improved misalignment process window as compared with a conventional situation in which the spacers are composed of the same material. The material constituting the etch mask 30 may be comprised of a layer of an organic material, such as an organic planarization layer (OPL).

The opening 32 may also partially or completely expose one or more of the hardmask sections 22 that are adjacent to the hardmask section 28 exposed by the opening 32. hardmask sections 28 that are outside of the opening 32 are protectively covered by the etch mask 30 during the etching process. The hardmask section 28 exposed by the opening 32 may be removed without significant etch erosion of any hardmask section 22 that is partially or completely exposed by the opening 32. The resulting fin cut through removal of the hardmask section 22 occurs before the masked etch of the substrate 16 to form fins from the semiconductor material of the substrate 16.

Figure 7:
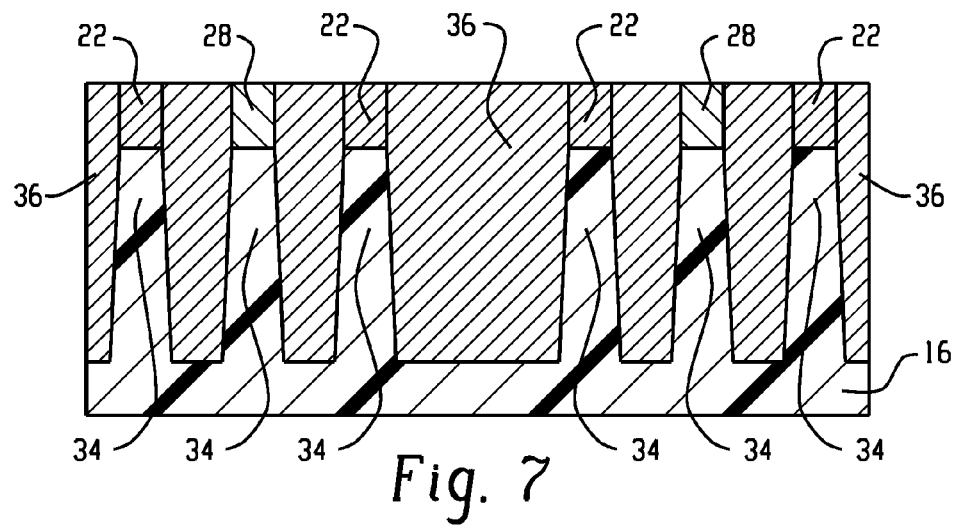
FIGS. 7-11 are cross-sectional views of the substrate portion of FIG. 5 at successive stages of a processing method in accordance with embodiments of the invention.

With reference to FIG. 7 in which like reference numerals refer to like features in FIG. 6 and at a subsequent fabrication stage, the hardmask sections 22, 28 may be used as an etch mask during an etching process that etches the substrate 16 to form fins 34. A fin 34 is not formed at the location of the removed hardmask section 28. The space between adjacent pairs of fins 34 may be filled with a dielectric layer 36, which is later recessed, to provide electrical isolation. The layer 36 may be composed of silicon dioxide ($SiO_2$) deposited by CVD and planarized with CMP to the top surfaces of the hardmask sections 22, 28.

The fins 34 may be used to form one or more fin-type field-effect transistors (FinFETs) that further include a functional gate structure spacers, source and drain regions, etc. The functional gate structure may be formed utilizing either a gate-first or a gate-last process.

Figure 8:
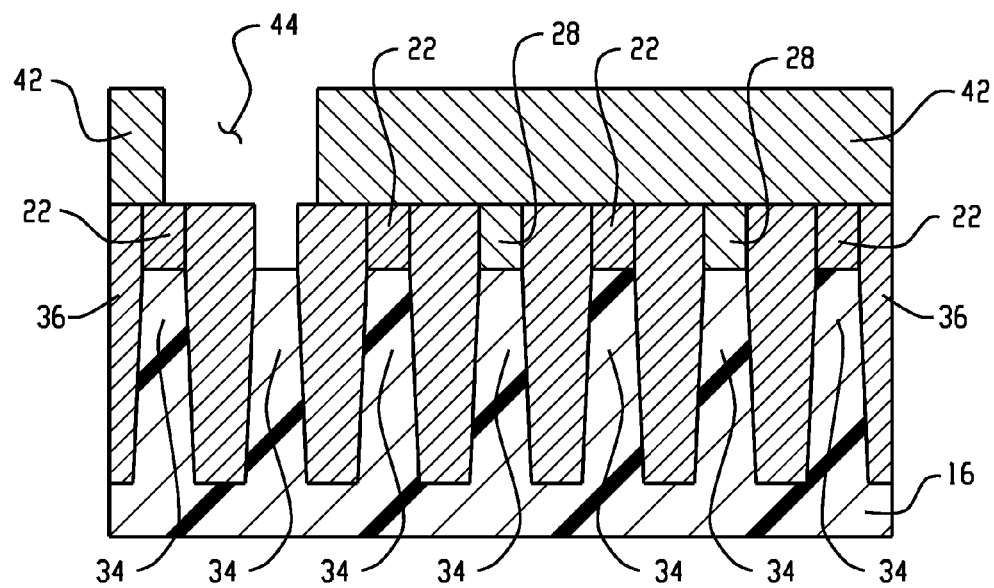

With reference to FIG. 8 in which like reference numerals refer to like features in FIG. 5 and at a subsequent fabrication stage, the fins 34 may be formed with all of the hardmask sections 22, 28 intact, and the dielectric layer 36 may be formed and planarized. After the fins 34 are formed, a range of the hardmask sections 22, 28 that includes two or more of the hardmask sections 22 and two or more of the hardmask sections 28 may be selected for removal. A cut or etch mask 42, which is similar to etch mask 30, may be applied with a window or opening 44 that exposes one of the hardmask sections 28 for removal by cutting with an etching process as part of a fin cut last process. The hardmask section 28 that is exposed is located at an extrema of the range of hardmask sections 22, 28 selected for removal. The etching process removes the hardmask section 28 exposed by the opening 44 selective to any of the hardmask sections 22 that may be exposed by the opening 44. As a consequence of the selective removal, the opening 44 can be formed with a width that is equal to the critical dimension (i.e., minimum feature size) of the photolithography tool and that is tolerant to misalignment. The etch mask 42 is removed following the completion of the etching process.

Figure 9:
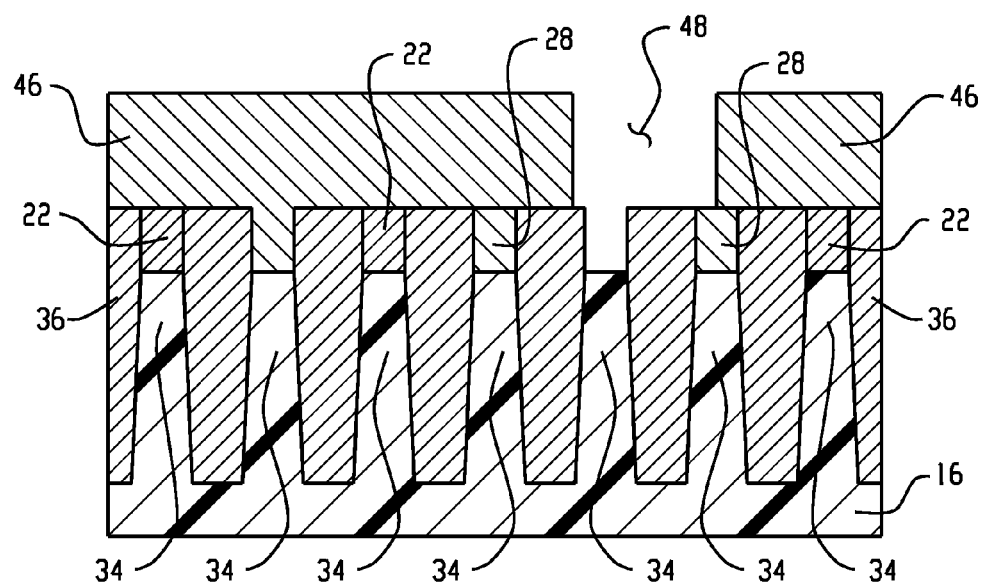

With reference to FIG. 9 in which like reference numerals refer to like features in FIG. 8 and at a subsequent fabrication stage, a cut or etch mask 46, which is also similar to etch mask 30, may be applied and patterned to form a window or opening 48 that exposes one of the hardmask sections 22 for removal by cutting with an etching process. The hardmask section 22 that is exposed is located at an extrema of the range of hardmask sections 22, 28 selected for removal. The etching process removes the hardmask section 22 exposed by the opening 44 selective to any of the hardmask sections 28 that may be exposed by the opening 48. As a consequence of the selective removal, the opening 48 can be formed with a width that is equal to the critical dimension (i.e., minimum feature size) of the photolithography tool and is tolerant to misalignment. The etch mask 46 is removed following the completion of the etching process.

Figure 10:
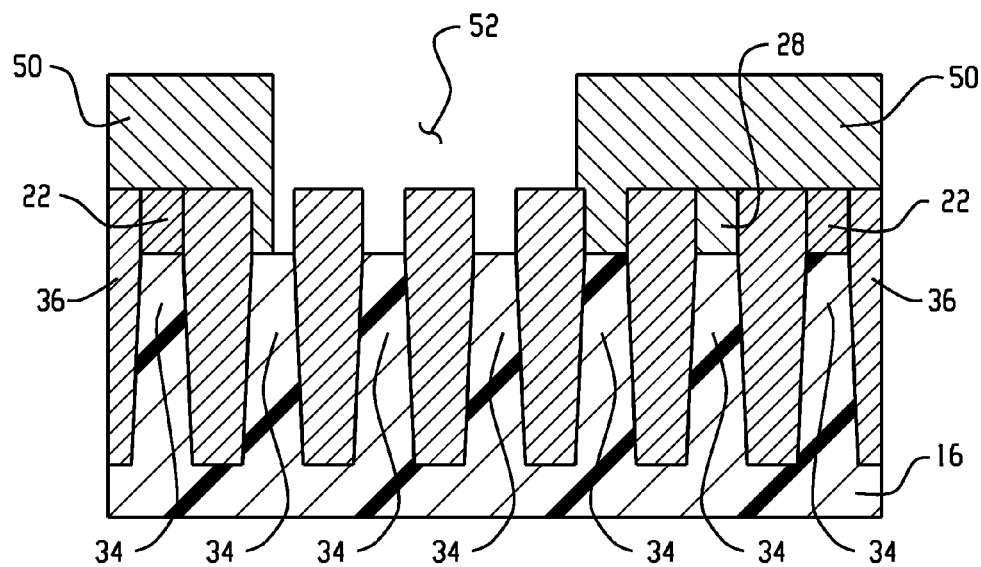

With reference to FIG. 10 in which like reference numerals refer to like features in FIG. 9 and at a subsequent fabrication stage, a cut or etch mask 50, which is also similar to etch mask 30, may be applied and patterned to form a window or opening 52 that exposes one of the hardmask sections 22 for removal by cutting with etching processes. The opening 52 spans a distance that exposes hardmask sections 22 and hardmask sections 28 of both material types that are located between the hardmask section 28 removed using etch mask 42 and the hardmask section 22 removed using the etch mask 46. An etching process is used to remove the hardmask section 22 exposed within the opening 52 selective to hardmask section 28 and the semiconductor material of the fins 34, and another etching process is used to remove the hardmask section 28 exposed within the opening 52 selective to the semiconductor material of the fins 34. In an alternative embodiment, the reverse sequence of etching processes may be used to remove the hardmask sections 22, 28 exposed within the opening 52. The initial removal of the hardmask section 28 using etch mask 42 and the hardmask section 22 using the etch mask 46 resolves a problem associated with the critical resolution at minimum pitch of the fins 34. The removal of the both types of hardmask sections 22, 28 using etch mask 50 and different etching processes is a non-critical cut. The etch mask 50 is removed following the completion of the etching process.

Figure 11:
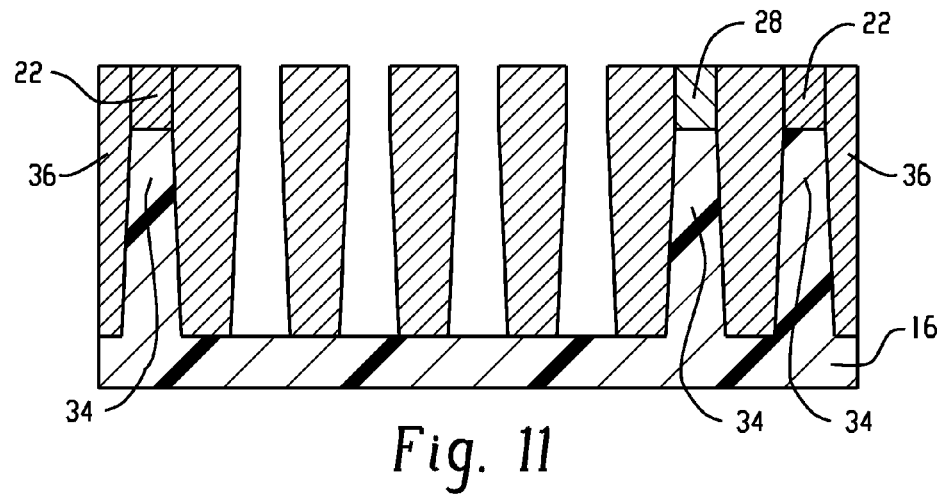

With reference to FIG. 11 in which like reference numerals refer to like features in FIG. 10 and at a subsequent fabrication stage, the fins 34 that are not covered by one or the other of the hardmask sections 22, 28 may be removed by anisotropic and/or isotropic etching processes. A layer (not shown) of a dielectric material may be applied and planarized to fill the open spaces created when the fins 34 to be cut are removed. The dielectric layer may be composed of silicon dioxide ($SiO_2$) deposited by CVD.

Figure 12:
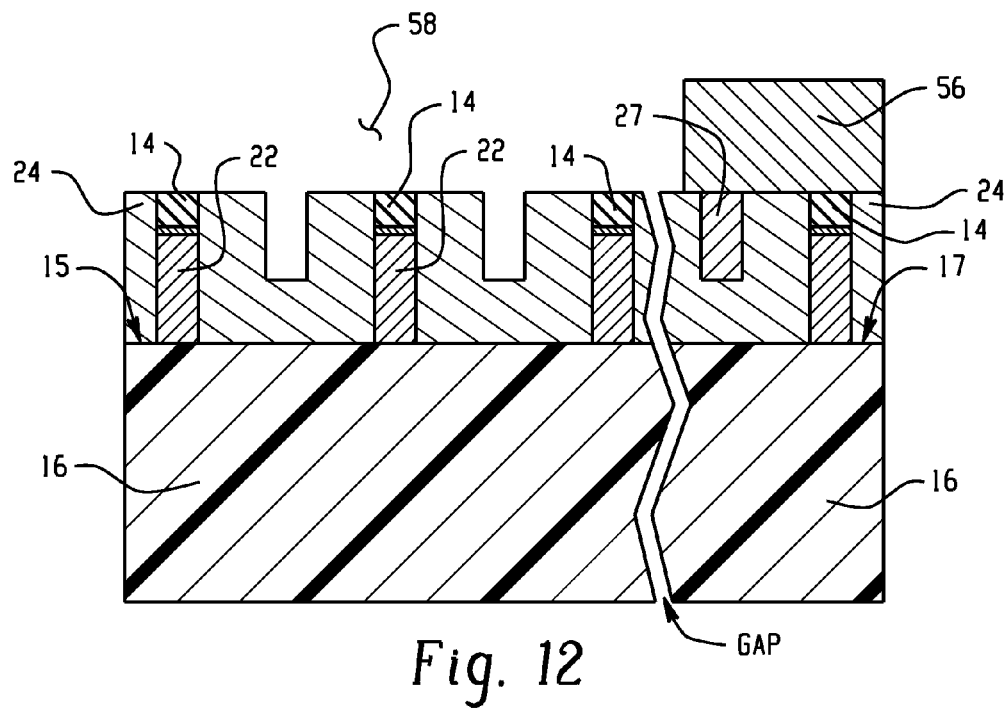
FIG. 12 is a cross-sectional view of the substrate portion of FIG. 4 at a subsequent stage of a processing method in accordance with embodiments of the invention.

With reference to FIG. 12 in which like reference numerals refer to like features in FIG. 5 and at a subsequent fabrication stage in accordance with alternative embodiments, a block or etch mask 56, which is similar to etch mask 30, may be applied and patterned to form a window or opening 58 that exposes the hardmask sections 28 in one region 15 of the substrate 16 for removal by cutting with an etching process. The hardmask sections 28 are susceptible to removal by being exposed at the top surface of the conformal layer 24. The hardmask sections 28 in another region 17 of the substrate 16 are covered and protected by the etch mask 56 during the etching process. The result is that the fins 34 formed in the region 15 of the substrate 16 lacking the hardmask sections 28 will have a fin pitch given by the pitch of the hardmask sections 28, and fins formed in region 17 of the substrate 16 will have a narrower fin pitch because the hardmask sections 28 are present when the fins 34 are etched. The etch mask 46 is removed following the completion of the etching process.

Figure 13:
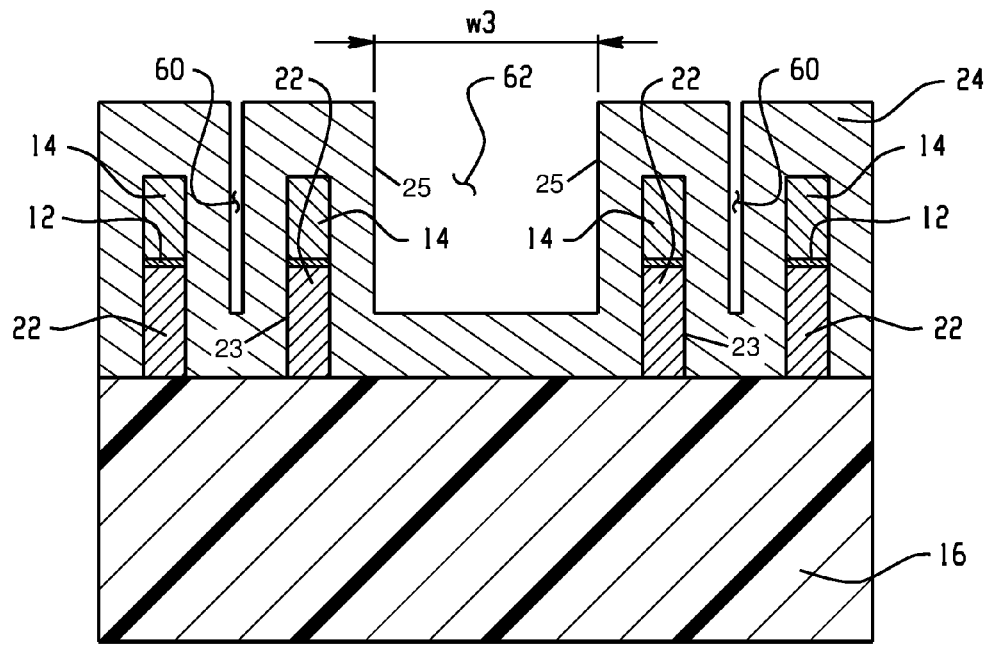
FIGS. 13-17 are cross-sectional views of the substrate portion of FIG. 5 at successive stages of a processing method in accordance with embodiments of the invention.

With reference to FIG. 13 in which like reference numerals refer to like features in FIG. 3 and in accordance with alternative embodiments, the spacing between adjacent mandrels 18 may be increased such that the pitch of the spacers 20 is non-uniform. After the conformal layer 24 is deposited, some of the hardmask sections 22 formed from spacers 20 are separated by narrow recesses 60 and some of the hardmask sections 22 formed from spacers 20 are separated by a recess 62 having a width W3. The recesses 60 may be nearly filled by the material of the conformal layer resulting in near-pinchoff. Alternatively, pinchoff may be complete and the recesses 60 may be absent. The increased spacing of the mandrels 18 results in the recesses 62 being wider than the recesses 26.

Figure 14:
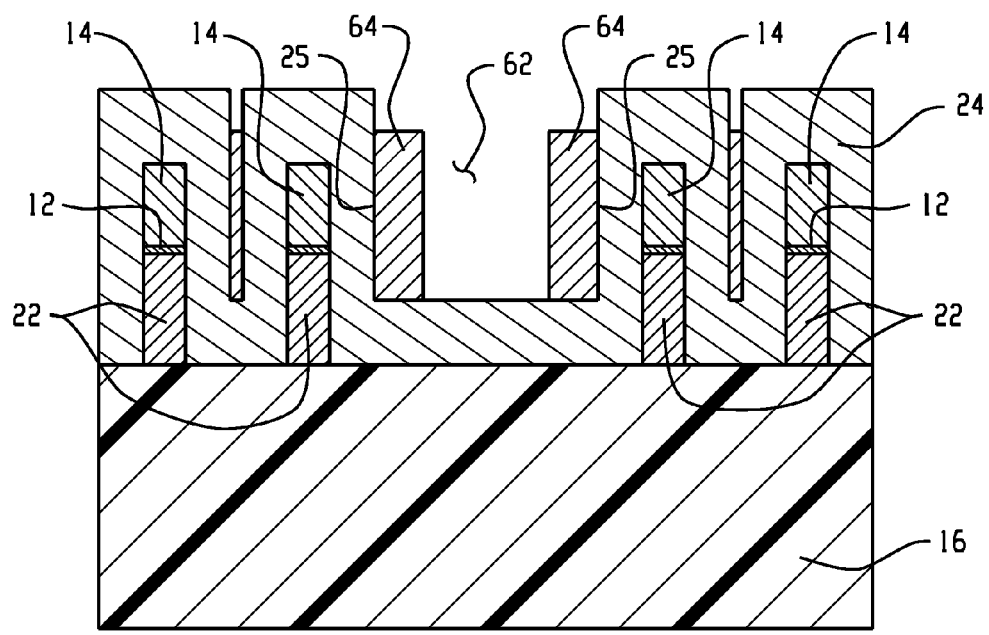

With reference to FIG. 14 in which like reference numerals refer to like features in FIG. 13 and at a subsequent fabrication stage, multiple spacers 64 are formed in the recess 62 on the vertical sidewalls 25 of the conformal layer 24 that border the recess 62. In this instance, a pair of spacers 64 is formed in the recess 62 on the sidewalls 25 of the conformal layer 24 between the sidewalls 23 of the adjacent pair of hardmask sections 22.

The spacers 64 may be formed by depositing a conformal layer comprised of a dielectric material and shaping the conformal layer with an anisotropic etching process, such as reactive ion etching, that preferentially removes the dielectric material from horizontal surfaces. The material constituting the spacers 64 is chosen to be selectively removed relative to the constituent material of the hardmask sections 22 through the choice of a suitable etch chemistry. In an embodiment, the spacers 64 may be composed of silicon dioxide ($SiO_2$) deposited by CVD. Material from the conformal layer may also fill the narrow spaces. The thickness of the spacers 64 eventually determines the thickness of fins formed from the spacers 64.

Figure 15:
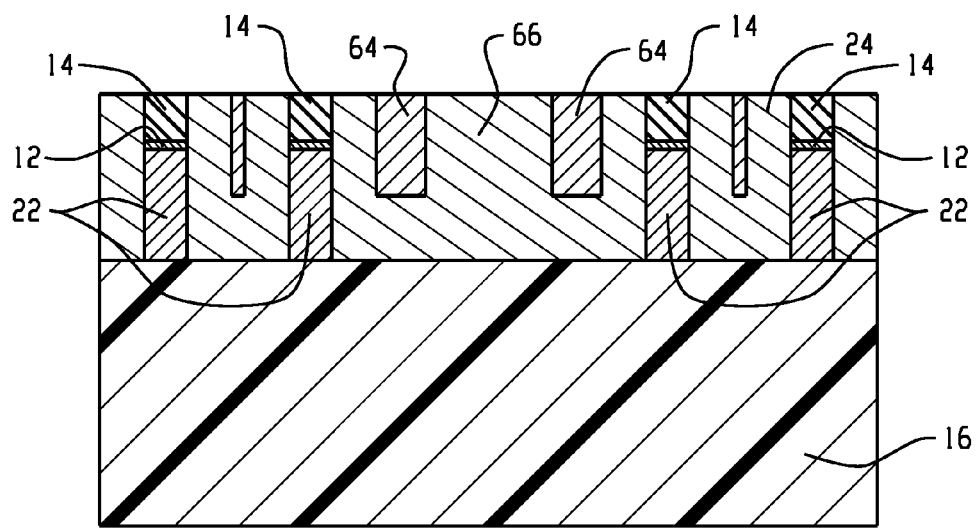

With reference to FIG. 15 in which like reference numerals refer to like features in FIG. 14 and at a subsequent fabrication stage, a layer 66 is deposited and planarized with, for example, CMP. After planarization, the layer 66 fills the portion of the recess 62 between the spacers 64. The layer 66 may be composed of the same material as the conformal layer 24 and, in an embodiment, the layer 66 may be composed of silicon nitride ($Si_3N_4$) deposited by CVD. As a consequence of the gap-fill deposition and planarization, the spacers 64 are embedded in the layers 24, 66.

Figure 16:
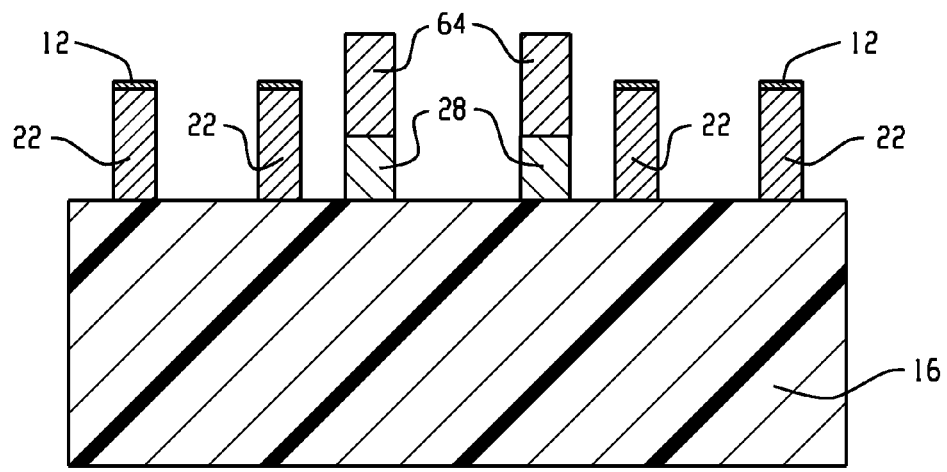

With reference to FIG. 16 in which like reference numerals refer to like features in FIG. 15 and at a subsequent fabrication stage, a block mask may be applied, an etching process used to remove the material from the recesses 60, and the block mask stripped. The conformal layer 24 and layer 66 are then etched with an anisotropic etching process, such as ME. Portions of the conformal layer 24 at the bottom of the recesses 60 are masked and protected by the spacers 64, which operate as elements of an etch mask, to form multiple hardmask sections 28 between an adjacent pair of hardmask sections 22. In this instance, a pair of hardmask sections 28 is formed in the recess 62 between an adjacent pair of hardmask sections 22. The material of the conformal layer 24 is also removed selective to the hardmask sections 22 and the material of the sacrificial layer 12 capping the hardmask sections 22. The sections of the sacrificial layer 12 may be subsequently removed from the hardmask sections 22. The spacers 64 may be removed from the hardmask sections 28.

Figure 17:
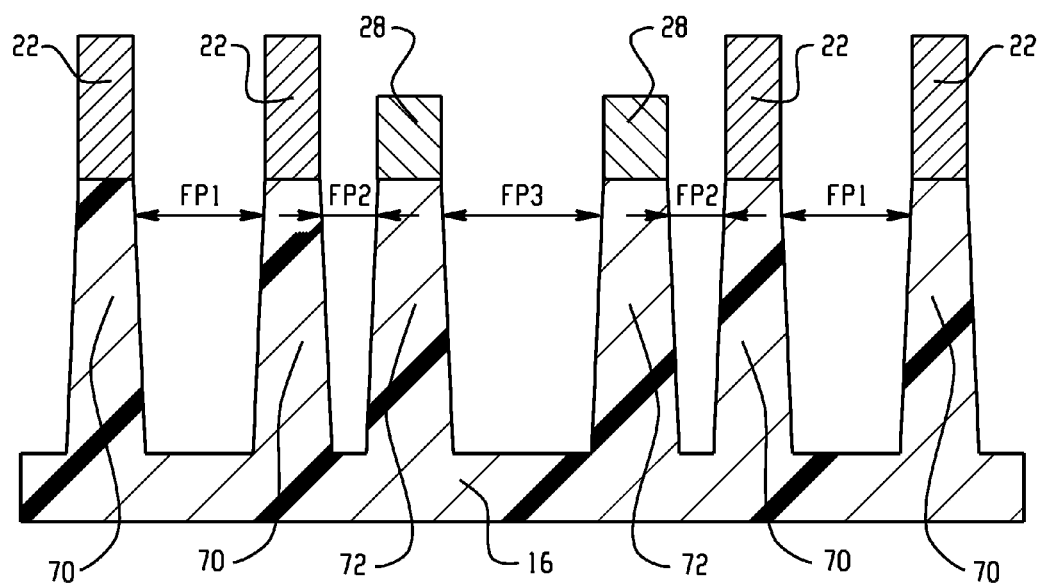

With reference to FIG. 17 in which like reference numerals refer to like features in FIG. 16 and at a subsequent fabrication stage, the hardmask sections 22, 28 may be used as a hardmask during an etching process that etches the substrate 16 to respectively form fins 70, 72. The fins 70, 72 have a variable fin pitch due to the locations of the hardmask sections 22, 28. The fins 70 and hardmask sections 22 may have a fin pitch, FP1, and the fins 72 and hardmask sections 28 may have a fin pitch, FP3. In an embodiment, these fin pitches may be equal. Each fin 70 is separated from an adjacent fin 72 by a fin pitch, FP2. The fin pitch, FP2, may be less than fin pitch, FP1, and may be less than fin pitch, FP3. The values of the fin pitches may be selected, among other factors, through the locations and thicknesses of hardmask sections 22, the thickness of the conformal layer 24, and the thickness of the hardmask sections 28 that is transferred from spacers 64.

The embodiments of the invention may address the RIE loading effect observed to effect critical dimension when forming fins and the reveal loading defect observed to effect fin height when revealing the fins. The critical dimension and height of the fins behave differently with different iso-dense bias, which may be determined from the difference between the critical dimensions for an isolated fin and for a densely-packed set of fins.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a first plurality of hardmask sections each comprised of a first material and each including sidewalls projecting from a substrate;
   forming a conformal layer that includes respective first portions on the sidewalls of each of the first plurality of hardmask sections, a recess between the first portions on the sidewalls of each adjacent pair of the first plurality of hardmask sections, and a second portion between the substrate and the recess, wherein the conformal layer is comprised of a second material chosen to etch selectively to the first material;
   forming a first spacer in each recess that masks the respective second portion of the conformal layer;
   after the first spacer is formed in each recess, etching the conformal layer to form a second plurality of hardmask sections each comprised of one of the second portions of the conformal layer; and
   etching the substrate with the first plurality of hardmask sections and the second plurality of hardmask sections masking the substrate to form a plurality of fins.

2. The method of claim 1 further comprising:
   removing at least one of the second plurality of hardmask sections selective to the first plurality of hardmask sections; and
   after the at least one of the second plurality of hardmask sections is removed, etching the substrate with the first plurality of hardmask sections and the second plurality of hardmask sections masking the substrate to form a plurality of fins at respective locations of the first plurality of hardmask sections and the second plurality of hardmask sections.

3. The method of claim 2 wherein removing at least one of the second plurality of hardmask sections selective to the first plurality of hardmask sections comprises:
   applying a third etch mask with an opening that exposes each of the second plurality of hardmask sections that is removed.

4. The method of claim 1 further comprising:
   before the fins are formed, removing all of the first plurality of spacers in a first region of the substrate while preserving the first plurality of spacers in a second region of the substrate,
   wherein the fins formed in the first region of the substrate have a first fin pitch, and the fins formed in the second region of the substrate have a second fin pitch that is less than the first fin pitch.

5. The method of claim 1 wherein the first material is silicon nitride and the second material is hydrogen-enriched silicon oxycarbide.

6. The method of claim 1 wherein the first plurality of hardmask sections and the second plurality of hardmask sections are interleaved in an alternating lengthwise parallel arrangement.

7. The method of claim 1 wherein a second spacer is formed in each recess and is spaced horizontally from the first spacer, the second spacer masks a third portion of the conformal layer between the recess and the substrate, and another of the second plurality of hardmask sections is formed from the third portion when the conformal layer is etched to form the second plurality of hardmask sections.

8. The method of claim 7 wherein each adjacent pair of the first plurality of hardmask sections is separated by a first distance, and each of the second plurality of hardmask sections is separated from the first plurality of hardmask section that is nearest in the adjacent pair by a second distance that is different from the first distance.

9. The method of claim 1 wherein the first spacer fills the respective recess, and one of the second plurality of hardmask sections is located between each adjacent pair of the first plurality of hardmask sections.

10. The method of claim 1 wherein each of the first plurality of hardmask sections is covered by a cap after the first plurality of hardmask sections are formed, and further comprising:
    after the conformal layer is etched to form the second plurality of hardmask sections and before the fins are formed, removing the cap from each of the first plurality of hardmask sections.

11. The method of claim 1 further comprising:
    after the fins are formed, selecting a range including two or more of the first plurality of hardmask sections and two or more of the second plurality of hardmask sections for removal;
    removing one of the first plurality of hardmask sections at a first extrema of the range selective to the second plurality of hardmask sections;

removing one of the second plurality of hardmask sections at a second extrema of the range selective to the first plurality of hardmask sections; and removing one or more of the first plurality of hardmask sections and one or more of the second plurality of hardmask sections that are located between the first extrema and the second extrema.

12. The method of claim 11 further comprising:

removing the fins associated with the two or more of the first plurality of hardmask sections and the two or more of the second plurality of hardmask sections that are removed.

13. The method of claim 11 wherein the one of first plurality of hardmask sections removed at the first extrema of the range and the one of second plurality of hardmask sections removed at the second extrema of the range are removed with respective cut masks that include an opening having a width equal to a minimum feature size.

14. The method of claim 1 wherein forming the first plurality of hardmask sections each comprised of the first material and each including sidewalls comprises:

forming a hardmask layer comprised of the first material on the substrate;

forming a plurality of mandrels on the hardmask layer;

forming a second plurality of spacers on sidewalls of the plurality of mandrels;

removing the mandrels selective to the second spacers;

etching the hardmask layer with the first plurality of spacers as an etch mask to transfer a pattern from the second plurality of spacers to the hardmask layer and form the first plurality of hardmask sections; and before the conformal layer is deposited, removing the second plurality of spacers.

15. The method of claim 1 wherein each second hardmask section is separated from each first hardmask section in the adjacent pair of the first plurality of hardmask sections by a distance related to a thickness of the conformal layer.

16. The method of claim 1 wherein the first plurality of hardmask sections are positioned with a first pitch and the second plurality of hardmask sections are positioned with a second pitch different than the first pitch.

17. The method of claim 1 wherein the first plurality of hardmask sections and the second plurality of hardmask sections are positioned with a given pitch.

* * * * *